United States Patent
Thompson et al.

(10) Patent No.: US 9,629,110 B2
(45) Date of Patent: Apr. 18, 2017

(54) WIRELESS COMMUNICATION APPARATUS AND METHOD PERFORMING SIGNAL SCANNING TO DETERMINE THE STRONGEST SIGNAL USEABLE FOR STABILIZING A LOCAL OSCILLATOR

(71) Applicant: Keysight Technologies Singapore (Holdings) Pte Ltd, Minneapolis, MN (US)

(72) Inventors: Steven Thompson, Forest, VA (US); Henry Lee, Lynchburg, VA (US)

(73) Assignee: Keysight Technologies Singapore (Holdings) Pte. Ltd., Singapore (SG)

( * ) Notice: Subject to any disclaimer, the term of this patent is extended or adjusted under 35 U.S.C. 154(b) by 6 days.

(21) Appl. No.: 13/856,269

(22) Filed: Apr. 3, 2013

(65) Prior Publication Data

US 2014/0302805 A1    Oct. 9, 2014

(51) Int. Cl.
  *H03L 7/06* (2006.01)
  *H03L 7/24* (2006.01)
  *H04W 56/00* (2009.01)

(52) U.S. Cl.
  CPC ........... *H04W 56/0015* (2013.01); *H03L 7/06* (2013.01); *H03L 7/24* (2013.01); *Y02B 60/50* (2013.01)

(58) Field of Classification Search
  CPC . H04W 56/0015; H04W 56/00; H04W 72/02; H03J 1/0091; H03J 1/0066; H03J 7/18; H03J 7/183; H04B 17/0057; H04B 1/1027; H04B 17/0042; H04B 17/00
  USPC ...................................................... 455/161.3
  See application file for complete search history.

(56) References Cited

U.S. PATENT DOCUMENTS

| | | | |
|---|---|---|---|
| 3,906,166 A | 9/1975 | Cooper et al. | |
| 6,311,059 B1 * | 10/2001 | Walton | 455/425 |
| 2002/0030519 A1 * | 3/2002 | Beaulieu | 327/156 |
| 2002/0123311 A1 * | 9/2002 | Nagayasu | 455/70 |
| 2003/0169776 A1 * | 9/2003 | Reesor | 370/503 |
| 2007/0202882 A1 * | 8/2007 | Ju et al. | 455/450 |
| 2007/0211669 A1 * | 9/2007 | Umatt et al. | 370/335 |
| 2009/0296641 A1 | 12/2009 | Bienas et al. | |
| 2010/0075684 A1 * | 3/2010 | Iwamura et al. | 455/449 |
| 2010/0216452 A1 * | 8/2010 | Gormley | 455/423 |
| 2011/0009119 A1 * | 1/2011 | Breuer et al. | 455/436 |
| 2012/0201195 A1 * | 8/2012 | Rausch et al. | 370/328 |

FOREIGN PATENT DOCUMENTS

| | | |
|---|---|---|
| DE | 102005063120 | 7/2007 |
| GB | 2 412 821 | 10/2005 |
| GB | 2412821 A | 10/2005 |

OTHER PUBLICATIONS

European Patent Office, Partial European Search Report, corresponding foreign counterpart European Application No. 14162029, issued Nov. 19, 2014, 3pgs.
European Search Report.
Extended European Search Report & Written Opinion for European Patent Application No. 14162029A, dated Mar. 10, 2015.

* cited by examiner

*Primary Examiner* — Devan Sandiford

(57) ABSTRACT

Apparatus and method are provided. The solution comprises controlling (202) a receiver to scan for signals transmitted by one or more base stations; determining (204) the strongest signal of the signals found during scanning and utilizing (206) the strongest signal as a reference signal for the receiver.

14 Claims, 5 Drawing Sheets

WIRELESS COMMUNICATION APPARATUS AND METHOD PERFORMING SIGNAL SCANNING TO DETERMINE THE STRONGEST SIGNAL USEABLE FOR STABILIZING A LOCAL OSCILLATOR

FIELD

The exemplary and non-limiting embodiments of the invention relate generally to an apparatus and a method in wireless communication networks. Embodiments of the invention relate especially to an apparatus configured to scan signals in wireless communication environment.

BACKGROUND

The following description of background art may include insights, discoveries, understandings or disclosures, or associations together with disclosures not known to the relevant art prior to the present invention but provided by the invention. Some of such contributions of the invention may be specifically pointed out below, whereas other such contributions of the invention will be apparent from their context.

Because frequency spectrum is a limited resource, several communication systems may share the same spectrum. In a given frequency spectrum a given number of frequency bands may be given to different operators or carriers in different locations. Typically each operator performs independent cellular coverage planning.

Present day methods for measuring cellular coverage in a cellular carrier's networks utilize radio scanners which operate in the cellular frequency bands. Typically, a route is driven using a vehicle equipped with the scanner equipment for collecting over-the-air downlink signals from the carrier's cell sites. Satellite positioning systems such as Global Positioning System GPS or Global Navigation Satellite System GLONASS is used to geographically map the coverage area using specific signaling parameters for a given cellular technology. For Global System for Mobile communication (GSM) systems, signaling parameters measured and collected include received signal strength (RSSI), carrier-to-noise plus interference (CINR), the base station identifier code (BSIC), and broadcast channel (BCCH) messages.

The scanners require stable frequency reference to be able to tune to unknown signals. Present-day equipment typically rely on GPS signals to obtain a frequency reference. However, there may be situations where GPS signals are not available. Thus, there is a need for an alternate frequency reference. The same applies to timing references. GPS may be used to obtain a stable timing reference. In the absence of a GPS signal, an alternate way of obtaining a timing reference is required.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to a more detailed description that is presented later.

According to an aspect of the present invention, there is provided an apparatus comprising at least one processor configured to cause the apparatus to: control a receiver to scan for signals transmitted by one or more base stations; determine the strongest signal of the signals found during scanning; utilize the strongest signal as a reference signal for the receiver.

According to another aspect of the present invention, there is provided a method for scanning signals, the method comprising: controlling a receiver to scan for signals transmitted by one or more base stations; determining the strongest signal of the signals found during scanning; utilizing the strongest signal as a reference signal for the receiver.

According to yet another aspect of the present invention, there is provided a computer program embodied on a distribution medium, comprising program instructions which, when loaded into an electronic apparatus, are configured to control the apparatus to execute processing comprising: controlling a receiver to scan for signals transmitted by one or more base stations; determining the strongest signal of the signals found during scanning; utilizing the strongest signal as a reference signal for the receiver.

LIST OF DRAWINGS

Embodiments of the present invention are described below, by way of example only, with reference to the accompanying drawings, in which FIG. 1 illustrates an example of a communication environment;

DESCRIPTION OF SOME EMBODIMENTS

Embodiments are applicable to any base station, user equipment (UE), server, corresponding component, and/or to any communication system or any combination of different communication systems that support required functionalities.

The protocols used, the specifications of communication systems, servers and user terminals, especially in wireless communication, develop rapidly. Such development may require extra changes to an embodiment. Therefore, all words and expressions should be interpreted broadly and they are intended to illustrate, not to restrict, embodiments.

Many different radio protocols to be used in communications systems exist. Some examples of different communication systems are GSM, the universal mobile telecommunications system (UMTS) radio access network (UTRAN or E-UTRAN), long term evolution (LTE, known also as E-UTRA), long term evolution advanced (LTE-A), Wireless Local Area Network (WLAN) based on IEEE 802.11 standard, worldwide interoperability for microwave access (WiMAX), personal communications services (PCS), systems using ultra-wideband (UWB) technology and systems utilizing Wideband Code Division Multiple Access (WCDMA), for example. IEEE refers to the Institute of Electrical and Electronics Engineers.

Figure 1:
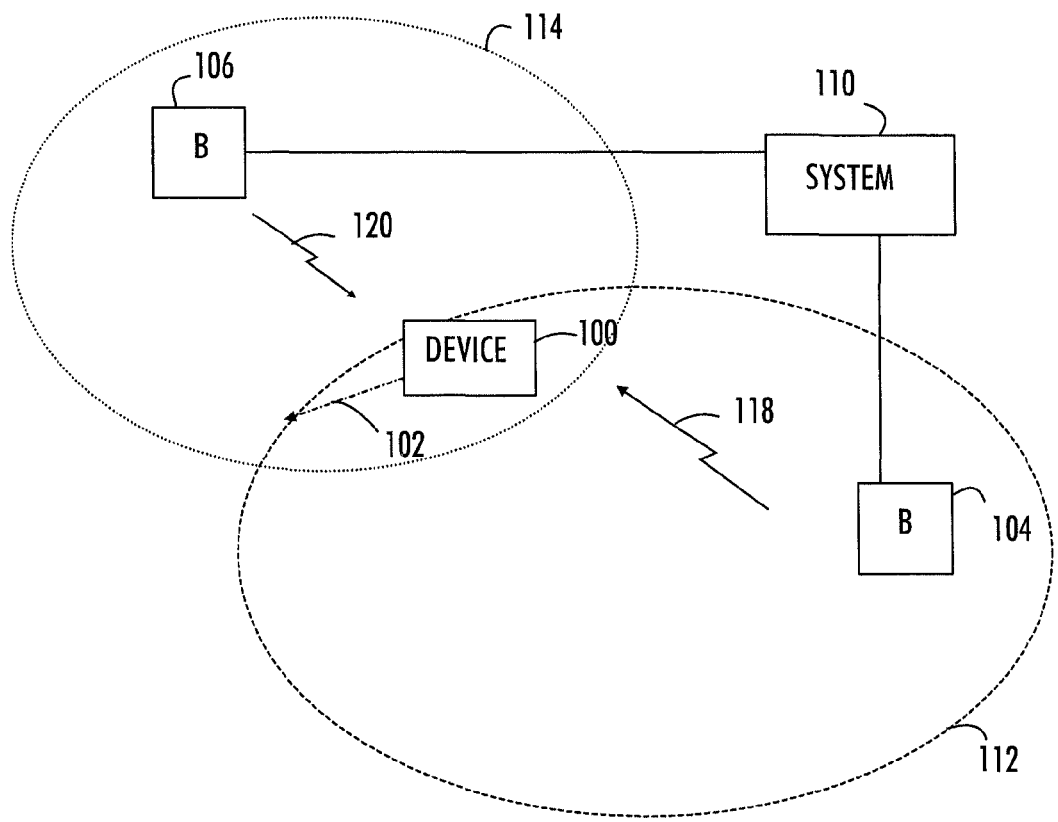

FIG. 1 illustrates a simplified view of a communication environment only showing some elements and functional entities, all being logical units whose implementation may differ from what is shown. The connections shown in FIG. 1 are logical connections; the actual physical connections may be different. It is apparent to a person skilled in the art that the systems also comprise other functions and structures. It should be appreciated that the functions, structures, elements and the protocols used in or for communication are irrelevant to the actual invention. Therefore, they need not to be discussed in more detail here.

FIG. 1 shows an apparatus 100 traveling 102 in an area which is served by more than one base stations 104, 106 of a communication system 110. The base stations have coverage areas 112, 114 where the transmissions of the base stations are well received.

The apparatus 100 is configured to receive the transmissions of the base stations. In this particular example, the apparatus 100 is so situated that it may receive the transmission 118 from base station 104 and the transmission 120 from base station 106. It should be noted that embodiments of the invention are not limited to any particular number of base stations.

The apparatus may be a scanner configured to measure and analyze the cellular coverage of a network or a system. Assume that in the example of FIG. 1 the apparatus is configured to measure the cellular coverage of system 110. The apparatus may also be user equipment configured by the system to perform measurements along with normal operation. The apparatus may be user equipment, mobile station, a fixed station, a portable or fixed communication apparatus, a measurement or analyzing device, a scanner or any other kind of device configured to receive transmissions from base stations of communication systems. The apparatus may be a standalone device or it may be connectable to other devices such as personal computers, analyzers or other devices.

In an embodiment, the apparatus 100 is a software defined radio SDR. In SDR, many components traditionally implemented with hardware are realized as software running in one or more processors.

The communication system 110 may be GSM based, LTE based or WCDMA based system, for example.

In an embodiment, the apparatus 100 is indoors traveling at a walking speed or is stationary. In many cases the continuous indoor use of the apparatus 100 may last for several hours or days. The indoor use of satellite positioning systems such as GPS as a stable frequency or timing reference is difficult due to low coverage. In many cases the GPS signals can be received only outdoors. Many scanners are not equipped with a high-stability voltage-controlled oscillator. For indoor applications this greatly reduces the scanners' ability to maintain a deterministic and stable frequency reference without the aid of GPS frequency and timing synchronization over long periods of time. This in turn decreases the scanner's ability to operate reliably.

Figure 2:
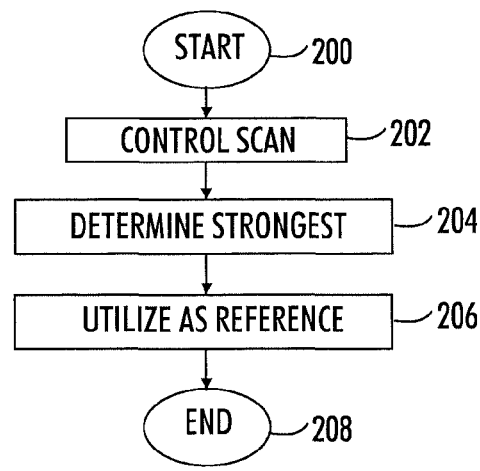
FIG. 2 is a flow chart illustrating an embodiment.

FIG. 2 is a flow chart illustrating an embodiment. The flow chart illustrates an example of the operation of an apparatus. The apparatus may be outside GPS coverage and unable to obtain frequency or timing synchronization from a GPS signal. In an embodiment, the apparatus may at power-up automatically determine whether a GPS signal is present or not and select the mode of operation for obtaining synchronization information and remain in the mode selected until powered down.

The process starts at step 200.

In step 202, the apparatus 100 is configured to scan for signals transmitted by one or more base stations 104, 106.

In step 204, the apparatus 100 is configured to determine the strongest signal of the signals found during scanning.

In step 206, the apparatus 100 is configured to utilize the strongest signal as a reference signal for the receiver.

The process ends at step 208.

In an embodiment, the apparatus is configured to utilize the strongest signal as a frequency reference for a local oscillator.

In an embodiment, the apparatus is configured to utilize the strongest signal as a time synchronization reference for the receiver.

Figure 3:
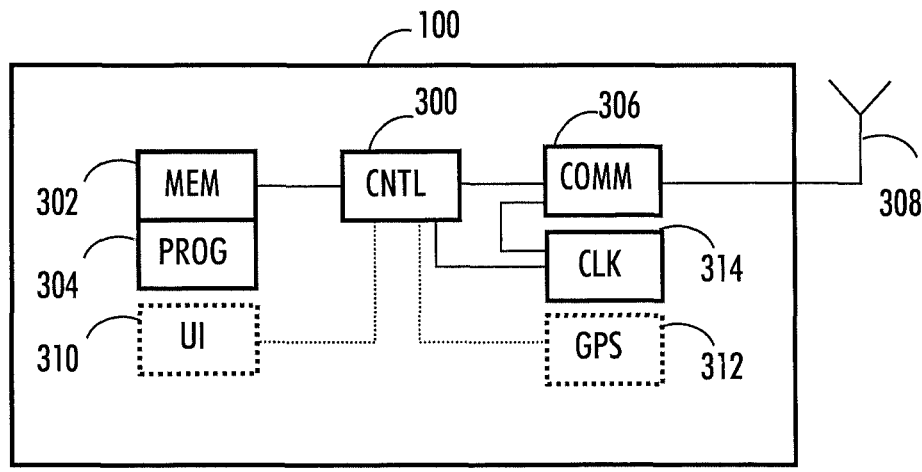
FIG. 3 illustrates an example of an apparatus.

FIG. 3 illustrates an embodiment. The figure illustrates a simplified example of an apparatus 100 applying embodiments of the invention. In some embodiments, the apparatus may be a user equipment of a communications system. The apparatus may further be a measurement or analyzing device, a scanner or any other kind of device configured to receive transmissions from transmitters of communication systems. The apparatus may be a standalone device or it may be connectable to other devices such as personal computers, analyzers or other devices.

The apparatus may also be interpreted as a circuitry implementing the required functionality within a user equipment of a communications system or an analyzing device.

It should be understood that the apparatus is depicted herein as an example illustrating some embodiments. It is apparent to a person skilled in the art that the apparatus may also comprise other functions and/or structures and not all described functions and structures are required. Although the apparatus has been depicted as one entity, different modules and memory may be implemented in one or more physical or logical entities.

The apparatus 100 of the example includes a control circuitry 300 configured to control at least part of the operation of the apparatus.

The apparatus may comprise a memory 302 for storing data. Furthermore the memory may store software 304 executable by the control circuitry 300. The memory may be integrated in the control circuitry.

The apparatus comprises a communications unit 306. The communications unit may be a receiver or a transceiver, for example. The communications unit is operationally connected to the control circuitry 300. It may be connected to an antenna arrangement 308.

The software 304 may comprise a computer program comprising program code means adapted to cause the control circuitry 300 of the apparatus to control the communications unit to scan transmissions from base stations of communications system or systems.

The apparatus may further comprise user interface 310 operationally connected to the control circuitry 300. The user interface may comprise a display, a keyboard or keypad, a microphone and a speaker, for example.

The apparatus may further comprise a satellite positioning receiver 312 such as a Global Positioning System (GPS) GPS or Global Navigation Satellite System (GLONASS) receiver operationally connected to the control circuitry 300.

The apparatus further comprises a local oscillator 314 connected to the control circuitry 300 and communications unit 306. The local oscillator provides a local system clock. The frequency of the local oscillator may vary depending of the type of the apparatus. In an embodiment, the frequency of the local oscillator is 76.8 MHz.

In many cases, apparatuses do not comprise a high-stability voltage-controlled oscillator. For indoor applications this greatly reduces the ability of apparatuses to maintain a deterministic and stable frequency reference without the aid of a GPS frequency and timing synchronization over long periods of time. There needs to be an automatic frequency tracking feature to serve as an alternate frequency lock mechanism.

To operate longer times in indoors or out of GPS coverage and maintain frequency lock a means for limiting the frequency drift and variability of the internal 76.8 MHz oscillator is to be provided.

In an embodiment, the apparatus is configured to identify one signal out of those tasked to be scanned as the strongest signal and track it based on measured carrier frequency offset (CFO) relative to the internal local 76.8 MHz oscillator. It can be safely assumed that all cell sites use a highly stable frequency reference and the carrier frequencies of the cell sites are accurate to within a few Hz. Therefore, most of the frequency offset can be attributed to our frequency reference particularly in a static or walking mode of operation. In these cases Doppler effect is negligible. The carrier frequency estimations for the various technologies have their own limitations especially under adverse conditions and increased variability under noisy and multipath conditions. However, by use of only the strongest received signals these limitations can be minimized.

The apparatus may be configured to monitor signals of more than one communications system. For example, any channels for GSM, WCDMA, or LTE technologies may be scanned. In addition to the strength of the signal the scan rate may be utilized when selecting the signal to be used as a reference. A good candidate will be one with the highest scan rate. The process may be automated so no operator intervention is required.

In an embodiment, the apparatus is configured to maintain a database of the strongest signals. The apparatus may be configured to determine the signal strength of a signal found during scanning, compare the signal strength to predetermined thresholds and if a threshold is exceeded store information on the signal to the database of strongest signals.

Figure 4:
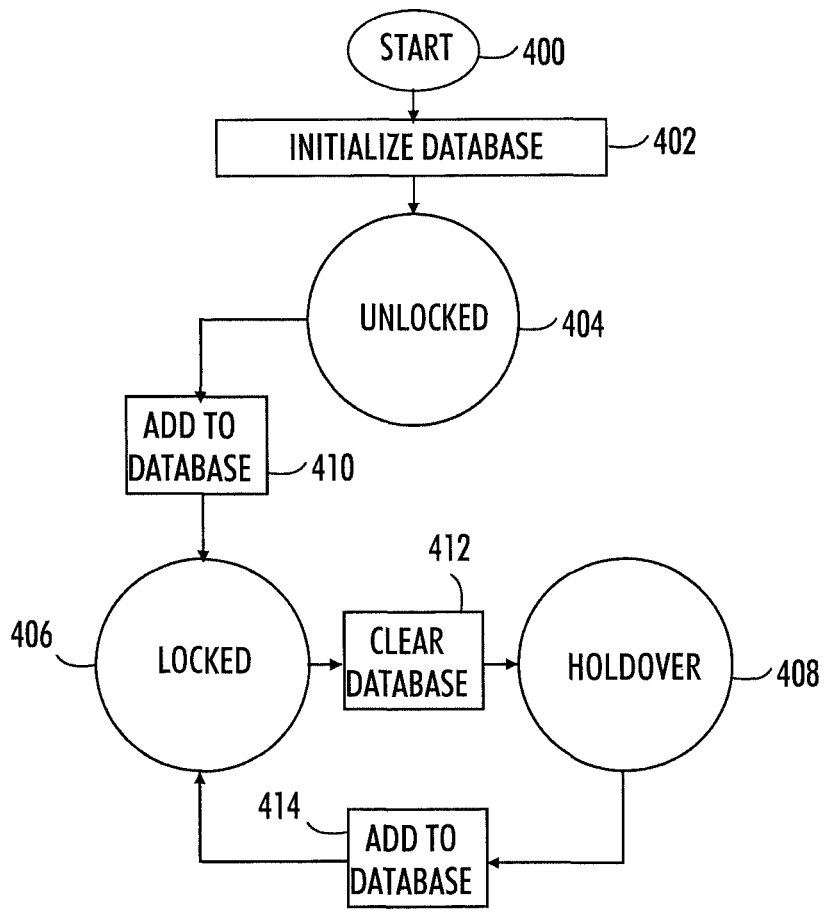
FIG. 4 illustrates an example of the operation of the apparatus.

FIG. 4 illustrates an example of the operation of the apparatus. The figure is a state diagram illustrating the states of frequency control. In an embodiment, the frequency control has three states, unlocked 404, locked 406 and holdover 408.

The state diagram starts at step 400.

In step 402, the database for strongest signals is initialized.

At first the frequency control is in unlocked-state 404. Unlocked-state is the initialization state where no signals have been detected yet. When a signal suitable for the database of the strongest signals is found, it is stored in the database in step 410. The frequency control moves to a locked-state 406. Locked-state means the apparatus has detected a signal which meets minimum strength parameters. The apparatus has started running a loop filter to tune the frequency reference.

If a signal is lost the database is cleared in step 412 and the frequency control moves to a holdover-state 408. Holdover-state means no signals have been detected in a given time (and at least one signal has been detected previously), so the loop filter cannot be updated. When a signal is found, it is added to the database in step 414 and the frequency control is again in the locked-state. In the Unlocked-state and Holdover-state, the local oscillator is programmed with a stored power-up value. In the Locked-state, the local oscillator is programmed with the output of the loop filter.

Let us first study embodiments where the strongest signal found during scanning is utilized as a frequency reference for a local oscillator.

In an embodiment, the carrier frequency offset CFO of the strongest signal relative to a local oscillator is determined. The frequency of the local oscillator is controlled on the basis of the carrier frequency offset.

CFO is the measured carrier frequency offset relative to the local oscillator frequency in the down conversion and baseband processing for the technology used. The measurement method of CFO may vary between technologies due to different modulation formats of the different technologies. As such the measurement of CFO is known in the art. The CFO parameter per technology specifies the frequency difference and hence the local oscillator offset required to resolve the offset or frequency error. For low to no Doppler conditions (i.e., static or walking speed) the CFO is a reliable indicator of local oscillator frequency offset. Thus, CFO may be described as the frequency difference measured between carrier frequency of cellular signal and expected carrier frequency relative to local reference oscillator in the receiving apparatus.

In an embodiment, a loop filter is used to provide a stable tracking loop using the CFO estimates as input. The loop filter controls the amount of error voltage used to trim the local oscillator using digital phase-locked loop methods. The output of the loop filter is modified by a voltage controlled oscillator VCO transfer function in digital domain. The adjusted value combined with the nominal digital-to-analog DAC value used to generate the nominal reference frequency (76.8 MHz, for example) becomes the digital-to-analog converter digital value used to generate the analog control voltage to the VCO. The loop filter steers the DAC voltage to track the carrier frequency.

In an embodiment, the loop filter procedure utilizes CFO values averaged to produce one value per a given time period. A typical time period is one second. The CFO values are fed to the loop filter to produce a new DAC value at a rate of one update per second, for example.

Cellular base stations use high-stability reference oscillators to maintain extremely accurate frequencies. This enables the apparatus to trim its local oscillator to the stable oscillator at the cell site using CFO.

In an embodiment, the loop filter may be realized as software executed by control circuitry.

Figure 5A:
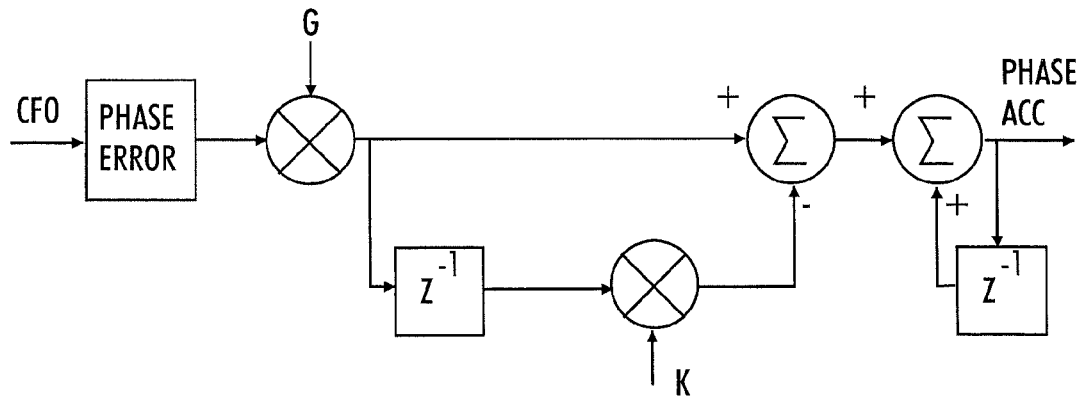
FIGS. 5A and 5B illustrate an example of a loop filter.
Figure 5B:
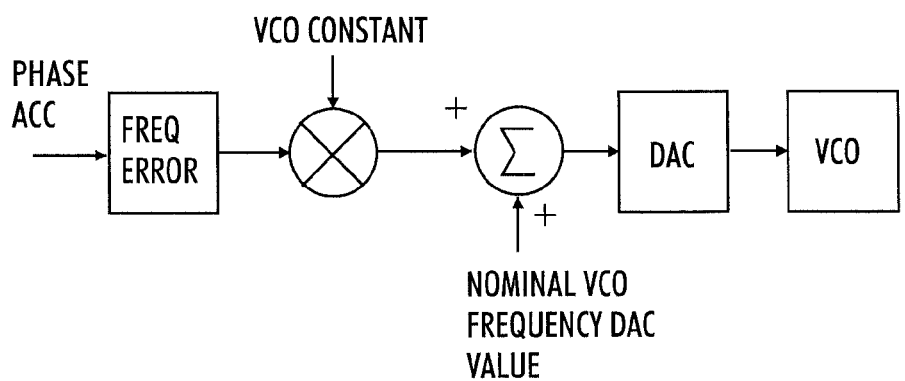

FIGS. 5A and 5B illustrate an example of a loop filter. The figures illustrate a schematic diagram of the operation of the filter. In an embodiment, the operation of the filter is based on the transfer function presented in the following equation which uses standard z-transform terminology:

$$H(z^{-1})=G/[1-Kz^{-1}]=G[(z-K)/z] \quad (1)$$

The coefficients G and K are constants and are determined by $$G=2-2*r*\cos(\theta)=2(1-e^{-dWnT}*\cos(WnT)) \quad (2)$$

$$K=(1-r^2)/G=(1-e^{-dWnT})/2*(1-e^{-dWnT\cos WnT}) \quad (3)$$

where
$\theta=WnT$,
$r=e^{-dWnT}$
T=update rate interval
$d=\sqrt{2}/2=0.7071$ (damping factor)
Wn=loop radian bandwidth The numerical values above are examples only. In an embodiment, when loop filter is updated once per second, the value of T is one second. Likewise Wn typically equals to ⅙ Hz for the update rate of once per second. The value of damping factor d has an effect on the stability of the loop filter. Also other values may be used.

The VCO constant multiplier and nominal VCO frequency DAC value of FIG. 5B are constants depending on the specifications of the specific VCO and DAC used (frequency of the VCO, the resolution and voltage range of the DAC, for example).

For example in a non-limiting embodiment, a 16-bit digital-to-analog converter with a 0 to 5 Volt range and a VCO with a 0 to 4 V range and a 3 parts-per-million (PPM) tuning pull range may be used. These specifications require the nominal DAC voltage to be set to 2 volts. In terms of DAC binary setting the value is computed as [(2^(#bits)*4V (VCO tune voltage))/5V (DAC voltage)]/2 or 26214 to set the 2.0 volt point. The VCO constant is computed as the multiplication of the VCO pull range times the nominal center frequency of the VCO divided by the pull range voltage. In this example embodiment, the VCO constant multiplier of FIG. 5B in the loop filter block diagram has a value $3e^{-06}*F_{VCO}/4$ where $F_{VCO}$ is the nominal frequency of the local oscillator, for example 76.8 MHz.

The transfer function of the VCO may be expressed as follows:

$$H(z^{-1})=1/(1-z^{-1})=z/(z^{-1})$$

In an embodiment, the control circuitry of the apparatus is configured to execute two processes: a first real-time process which is run continuously scans strongest signals the apparatus is able to receive. A second process is run once in a given time period which may be one second, for example. The second process utilizes the results of the first process and updates the VCO frequency.

Figure 6:
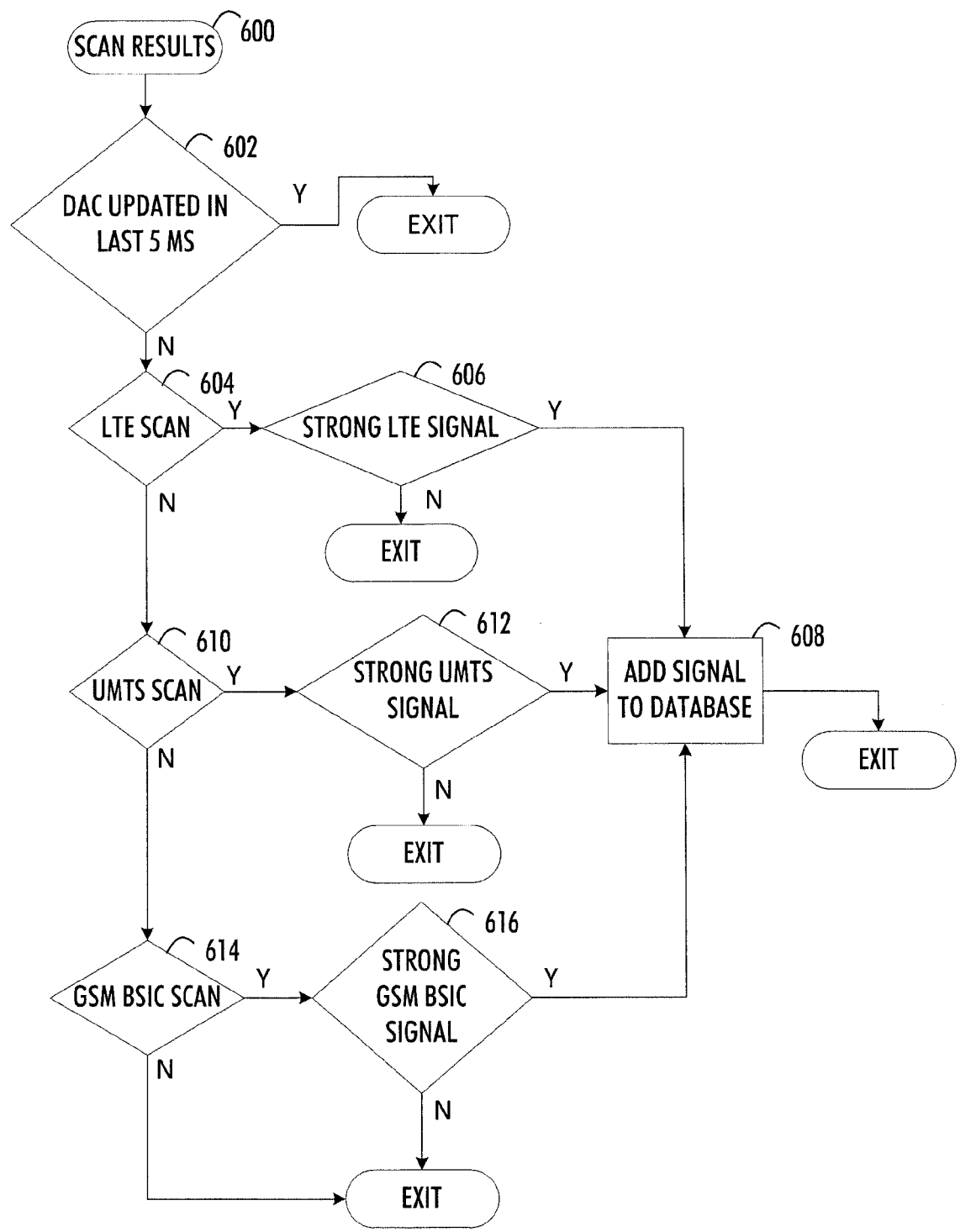
FIGS. 6 and 7 are flowcharts illustrating examples of embodiments of the invention.

FIG. 6 is a flowchart illustrating the first process. The process illustrates the operation of the control circuitry 300. In step 600, the control circuitry receives the scan results from the communication unit 306. The communication unit has performed a scan under the control of the control circuitry. In this non-limiting example the communication unit is able to scan LTE, UMTS and GSM signals. It is apparent to a person skilled in the art that the order of determining whether a scan for a particular type of signal was performed may be other than that described in this example.

In step 602, the control circuitry is configured to determine whether the DAC controlling the local oscillator has been updated in the last 5 ms. If this is so, the process is terminated.

If not, the control circuitry determines in step 604 whether a scan for LTE signals was performed. If so, the control circuitry determines in step 606 whether an LTE signal strong enough to be included in a database was received. In an embodiment, an LTE signal may be included in a database of strongest signals if given signal parameters exceed given thresholds. In case of an LTE signal, an example of parameters and thresholds may be given as:

PssIo>=−102.0 dB
EpssIo>=−4.0
EsssIo>=−4.0 where PssIo denotes primary synchronization channel signal power; EpssIo primary synchronization channel signal energy to noise power and EsssIo secondary synchronization channel signal energy to noise power. PssIo may also be referred as PSCH Io, EpssIo may also be referred as PSCH CINR and EsssIo may also be referred as SSCH CINR.

If these requirements are fulfilled, a signal may be added to a database in step 608. When a signal valid for a reference is found, the state of the frequency control may be set as "Locked".

If LTE scan was not performed, the control circuitry determines in step 610 whether a scan for UMTS signals was performed. If so, the control circuitry determines in step 612 whether an UMTS signal strong enough to be included in a database was received. In an embodiment, an UMTS signal may be included in a database of strongest signals if given signal parameters exceed given thresholds. In case of an UMTS signal, an example of parameters and thresholds may be given as:

Rssi>=−102.0 dB
EcIo>=−18.0 dB where Rssi denotes received signal strength indicator and EcIo denotes the ratio of the received energy per chip and the interference level.

If these requirements are fulfilled, a signal may be added to a database in step 608. When a signal valid for a reference is found, the state of the frequency control may be set as "Locked".

If UMTS scan was not performed, the control circuitry determines in step 614 whether a scan for GSM signals was performed. If so, the control circuitry determines in step 616 whether a GSM signal strong enough to be included in a database was received. In an embodiment, a GSM signal may be included in a database of strongest signals if given signal parameters exceed given thresholds. In case of a GSM signal, an example of parameters and thresholds may be given as:

Rssi>=−102.0
Cinr>=5.0
Bsic 0 to 63 where Rssi denotes received signal strength indicator and Cinr denotes carrier to interference-plus-noise ratio and Bsic denotes base station identity code.

If these requirements are fulfilled, a signal may be added to a database in step 608. When a signal valid for a reference is found, the state of the frequency control may be set as "Locked".

Figure 7:
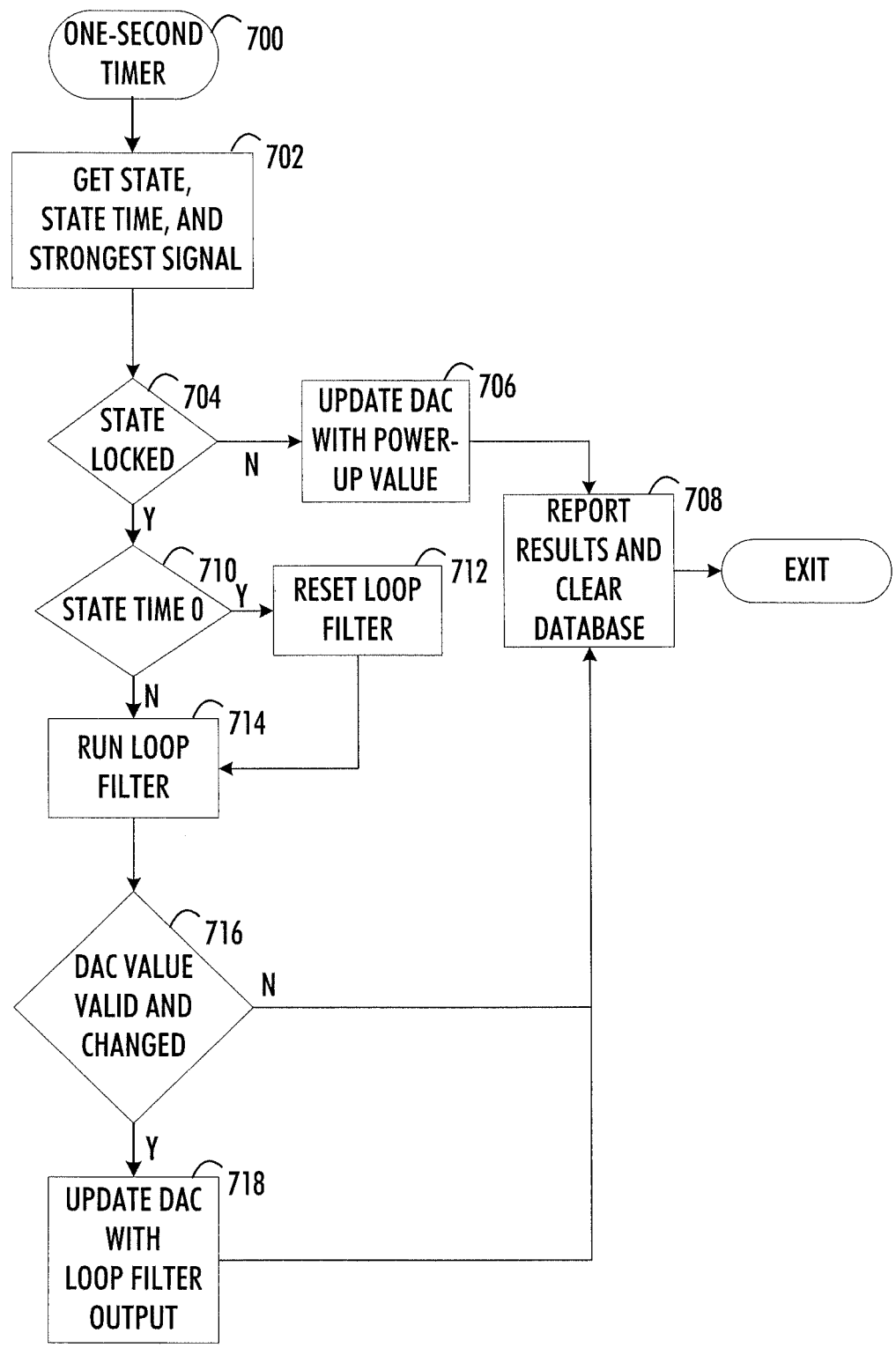

FIG. 7 is a flowchart illustrating the second process which is run once in a given time period which may be one second, for example. The second process utilizes the results of the first process and updates the VCO frequency.

The process illustrates the operation of the control circuitry 300. In step 700, the process starts when a timer expires.

In step 702, the control circuitry obtains the frequency control state, state time and retrieves information on the strongest signal from the data base.

The strongest signal is selected from the signals stored in the data base. A score is assigned to each signal which is the sum of differences between actual values and minimum values. This scoring method accounts for both quality and number of samples. In an embodiment, the scores are calculated as follows:

$$\text{LTE: sum of } (\text{PssIo}-\text{PssIo}_{Min})+(\text{EpssIo}-\text{EpssIo}_{Min})+(\text{EsssIo}-\text{EsssIo}_{Min})$$

$$\text{UMTS: sum of } (\text{Rssi}-\text{Rssi}_{Min})+(\text{EcIo}-\text{EcIo}_{Min})$$

$$\text{GSM: sum of } (\text{Rssi}-\text{Rssi}_{Min})+(\text{Cinr}-\text{Cinr}_{Min})$$

In an embodiment, the score is determined when information on the signal is stored in the database. The database may store the sum of the scores in the last second (or the time period of the process) for each signal. Storing the sum instead of raw values or the mean takes into account both signal strength and scan rate when evaluating the strongest signal.

The signal with the highest score is selected. In an embodiment, LTE is given preference, then WCDMA, then GSM.

In step 704, the control circuitry determines whether the state is "Locked". If not, the scan performed has not found any signals. The DAC controlling the local oscillator is updated with a power-up value in step 706. The database is cleared in step 708 and a report may be generated to the user interface of the apparatus and the process is terminated.

If the state is "Locked" the control circuitry determines in step 710 from the state time parameter whether a new strongest signal has been found during the last second (or the time period of the process).

If yes, the loop filter is reset in step 712. If not, the strongest signal has not changed.

In step 714, the loop filter procedure is executed. The loop filter input is the mean of the CFO values for the last second (or the time period of the process) for the strongest signal.

In step 716, the control circuitry determines whether the DAC value (output of the loop filter) is valid and has changed. If not the process continues in step 708.

If yes, the DAC is updated with the loop filter output in step 718 and the process continues in step 708.

In addition to above-described frequency reference use, the strongest signal during scanning may be utilized as a time synchronization reference for the receiver. In general, a GPS signal may provide a timing synchronization for a receiver. The procedure similar to above may provide the required time synchronization reference for example in situations where GPS in unavailable.

Figure 8:
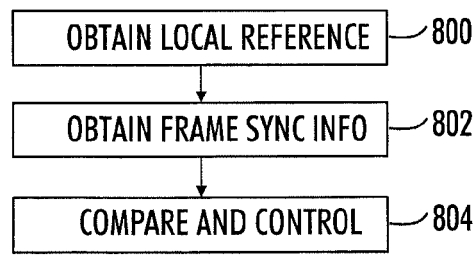
FIG. 8 is a flowchart illustrating an embodiment.

FIG. 8 illustrates an example of an embodiment. Typically cellular cell cites maintain accurate timing references. The signals from cellular cell sites may provide more accurate time reference than GPS.

In step 800, a local timing within the apparatus is obtained by dividing the local oscillator by a fixed predetermined number of clock periods.

In step 802, information on frame synchronization of the strongest signal is obtained. Obtaining a frame timing reference from the strongest signal varies depending on technology. In GSM several timing references can be used including the 4.615 ms 8 slot timing signified by synchronization channel SCH burst correlations or a timing signified by broadcast control channel BCCH bursts every 51 frames in the GSM 51 frame multi-frame TDMA format.

For WCDMA and LTE, the frame lengths of 10 ms provide a 10 ms timing reference. The primary and secondary synchronization signals are used to identify the frame timing relative to the local clock divided down to the frame timing reference per technology. For LTE the local timing epoch would be 10 ms.

In step 804, the local timing is compared to the frame synchronization information of the strongest signal and adjusted. The comparison and adjustment may be performed using a secondary tracking loop on the frame synchronization of the strongest signal.

Once carrier frequency is acquired to within a few Hz the secondary loop of tracking the timing of a signal can be achieved using an early-late gate type of tracking algorithm and adjusting the VCO frequency as required to maintain frame timing. In an embodiment, an update rate of once per second may maintain synchronization for all technologies to within the accuracy of the transmitted reference signal.

The control circuitries able to perform the above-described steps may be implemented as an electronic digital computer, which may comprise a working memory (RAM), a central processing unit (CPU), and a system clock. The CPU may comprise a set of registers, an arithmetic logic unit, and a controller. The controller is controlled by a sequence of program instructions transferred to the CPU from the RAM. The controller may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The electronic digital computer may also have an operating system, which may provide system services to a computer program written with the program instructions.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present.

This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

An embodiment provides a computer program embodied on a distribution medium, comprising program instructions which, when loaded into an electronic apparatus, are configured to control the apparatus to execute the embodiments described above.

The computer program may be in source code form, object code form, or in some intermediate form, and it may be stored in some sort of carrier, which may be any entity or device capable of carrying the program. Such carriers include a record medium, computer memory, read-only memory, and a software distribution package, for example. Depending on the processing power needed, the computer program may be executed in a single electronic digital computer or it may be distributed amongst a number of computers.

The apparatus may also be implemented as one or more integrated circuits, such as application-specific integrated circuits ASIC. Other hardware embodiments are also feasible, such as a circuit built of separate logic components. A hybrid of these different implementations is also feasible. When selecting the method of implementation, a person skilled in the art will consider the requirements set for the size and power consumption of the apparatus, the necessary processing capacity, production costs, and production volumes, for example.

It will be obvious to a person skilled in the art that, as technology advances, the inventive concept can be implemented in various ways. The invention and its embodiments are not limited to the examples described above but may vary within the scope of the claim.

The invention claimed is:

1. A method for scanning signals, the method comprising:
   controlling a receiver to scan for signals transmitted by one or more base stations of one or more telecommunication systems;
   determining a strongest signal of the signals found during scanning and the frequency of strongest signal;

generating a corresponding frequency value utilizing the frequency of a local oscillator;

obtaining a carrier frequency offset by comparing the generated frequency and the frequency of the strongest signal with each other;

controlling the frequency of said local oscillator based at least in part on the determined carrier frequency offset; and identifying the strongest signal as a time synchronization reference for the receiver and tracking the strongest signal back to a measured carrier frequency offset relative to an internal local clock.

2. The method of claim 1, further comprising:

determining a timing offset of the strongest signal relative to a timing of the local oscillator; and controlling a timing of the receiver based at least in part on the timing offset.

3. A non-transitory computer readable medium comprising instructions, executable by a processor of a communications system to cause the communications system to perform a method for scanning signals, the method comprising:

controlling a receiver to scan for signals transmitted by one or more base stations of one or more telecommunication systems;

determining a strongest signal of the signals found during scanning and the frequency of the strongest signal;

generating a corresponding frequency value utilizing the frequency of the local oscillator;

obtaining a carrier frequency offset by comparing the generated frequency and the frequency of the strongest signal with each other; and controlling the frequency of said local oscillator based at least in part on the determined carrier frequency offset; and tracking the strongest signal as a time synchronization reference for the receiver, and the tracking the strongest signal back to a measured carrier frequency offset relative to an internal local clock.

4. An apparatus comprising:

a processor;

a local oscillator having a given frequency; and a receiver controlled by said processor to scan for signals transmitted by one or more base stations of one or more telecommunication systems, wherein said processor is configured to:

determine a strongest signal of the signals found during the scan and the frequency of the strongest signal;

generate a corresponding frequency value utilizing the frequency of the local oscillator;

obtain a carrier frequency offset by comparing the generated frequency and the frequency of the strongest signal with each other; and control the frequency of said local oscillator based at least in part on the determined carrier frequency offset; and identifies the strongest signal as a time synchronization reference for the receiver, and tracking the strongest signal back to a measured carrier frequency offset relative to an internal local clock.

5. The apparatus of claim 4, wherein said processor determines the carrier frequency offset by averaging the carrier frequency offset over a predetermined time period prior to controlling the frequency of said local oscillator.

6. The apparatus of claim 4, wherein said receiver utilizes the strongest signal as a time synchronization reference.

7. The apparatus of claim 6, wherein said processor determines a timing offset of the strongest signal relative to a timing of said local oscillator, and wherein said processor controls the timing of said receiver based at least in part on the determined timing offset.

8. The apparatus of claim 4, wherein the determination of the strongest signal is based at least in part on at least one of signal strength and scan rate of the signals found during the scan.

9. The apparatus of claim 4, wherein said processor controls said receiver to scan for signals transmitted by said one or more base stations in the following order of radio protocols: Long Term Evolution ("LTE"), Universal Mobile Telecommunications System ("UMTS"), and Global System for Mobile Communication ("GSM").

10. The apparatus of claim 4, further comprising a database for maintaining a listing of the strongest signals.

11. The apparatus of claim 10, wherein said processor determines a signal strength of a first signal found during the scan, compares the signal strength of the first signal to a predetermined threshold, and stores information regarding the first signal in said database upon the condition that the signal strength of the first signal exceeds the predetermined threshold.

12. The apparatus of claim 4, wherein a first signal of the signals found during the scan is a Long Term Evolution ("LTE") signal, and wherein said processor determines a signal strength of the first signal by evaluating at least one of a primary synchronization channel signal power ("PssIo"), the primary synchronization signal energy to noise power ratio ("EpssIo"), and the secondary synchronization signal energy to noise power ratio ("EsssIo").

13. The apparatus of claim 4, wherein a first signal of the signals found during the scan is a Universal Mobile Telecommunications System ("UMTS") signal, and wherein said processor determines a signal strength of the first signal by evaluating at least one of a received signal strength indicator ("RSSI") and an energy per chip/noise spectral density ("Ec/Io").

14. The apparatus of claim 4, wherein a first signal of the signals found during the scan is a Global System for Mobile Communication ("GSM") signal, and wherein said processor determines a signal strength of the first signal by evaluating at least one of a received signal strength indicator ("RSSI"), a carrier-to-noise plus interference ("CINR"), and a base station identifier code ("BSIC").

* * * * *